United States Patent
Lin

(10) Patent No.: US 7,875,805 B2
(45) Date of Patent: Jan. 25, 2011

(54) WARPAGE-PROOF CIRCUIT BOARD STRUCTURE

(75) Inventor: Wei-Hung Lin, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 454 days.

(21) Appl. No.: 12/039,997

(22) Filed: Feb. 29, 2008

(65) Prior Publication Data
US 2008/0210459 A1   Sep. 4, 2008

(30) Foreign Application Priority Data
Mar. 2, 2007   (TW) ............................... 96107115 A

(51) Int. Cl.
*H05K 1/03* (2006.01)
(52) U.S. Cl. ................. 174/255; 174/260; 174/261; 174/262; 174/263; 257/673; 257/700; 257/723; 257/778; 438/106; 438/612; 361/790; 361/795; 361/803
(58) Field of Classification Search ................. 174/255, 174/260–263; 257/700, 778, 673, 723; 438/106, 438/612; 361/790, 795, 803
See application file for complete search history.

(56) References Cited

U.S. PATENT DOCUMENTS

| | | | |
|---|---|---|---|
| 5,656,550 A * | 8/1997 | Tsuji et al. ................... | 438/123 |
| 6,036,836 A * | 3/2000 | Peeters et al. ................ | 205/125 |
| 6,461,953 B1 * | 10/2002 | Sakuyama et al. .......... | 438/612 |
| 6,479,887 B1 * | 11/2002 | Yoon et al. ................... | 257/666 |
| 6,525,275 B1 * | 2/2003 | Asai ............................ | 174/255 |
| 6,582,581 B1 * | 6/2003 | Goldberg et al. ............. | 205/125 |
| 6,759,596 B1 * | 7/2004 | Shelnut et al. ............... | 174/255 |
| 6,944,945 B1 * | 9/2005 | Shipley et al. ................ | 29/852 |
| 7,114,251 B2 * | 10/2006 | Mashino ....................... | 29/852 |
| 7,122,907 B2 * | 10/2006 | Lee .............................. | 257/778 |
| 7,352,054 B2 * | 4/2008 | Jobetto ........................ | 257/673 |
| 7,452,797 B2 * | 11/2008 | Kukimoto et al. ........... | 438/612 |
| 7,517,788 B2 * | 4/2009 | Pang et al. ................... | 438/613 |
| 7,745,736 B2 * | 6/2010 | Ogawa et al. ................ | 174/262 |
| 2004/0046252 A1 * | 3/2004 | Fujimori et al. ............. | 257/734 |
| 2004/0142226 A1 * | 7/2004 | Yamauchi et al. ............ | 429/38 |
| 2005/0170631 A1 * | 8/2005 | Yuri ............................ | 438/618 |
| 2006/0131730 A1 * | 6/2006 | Nakamura ................... | 257/700 |
| 2007/0018308 A1 * | 1/2007 | Schott et al. ................. | 257/700 |
| 2007/0045867 A1 * | 3/2007 | Machida ...................... | 257/778 |

\* cited by examiner

*Primary Examiner*—Xiaoliang Chen
(74) *Attorney, Agent, or Firm*—Schmeiser, Olsen & Watts LLP

(57) ABSTRACT

The invention provides a warpage-proof circuit board structure, including: an inner layer circuit board; at least one dielectric layer formed on at least one surface of the inner layer circuit board; at least one first groove formed in the at least one dielectric layer corresponding in position thereto; a solder mask formed on the surface of the dielectric layer, a second groove formed in the solder mask and corresponding in position to the first groove formed in the dielectric layer; and a metal frame formed in the first and second grooves and protruding from the surface of the solder mask, thereby strengthening the circuit board to prevent it from warping in thermal processing and further using the metal frame as a heat-dissipating means for the package structure.

11 Claims, 7 Drawing Sheets

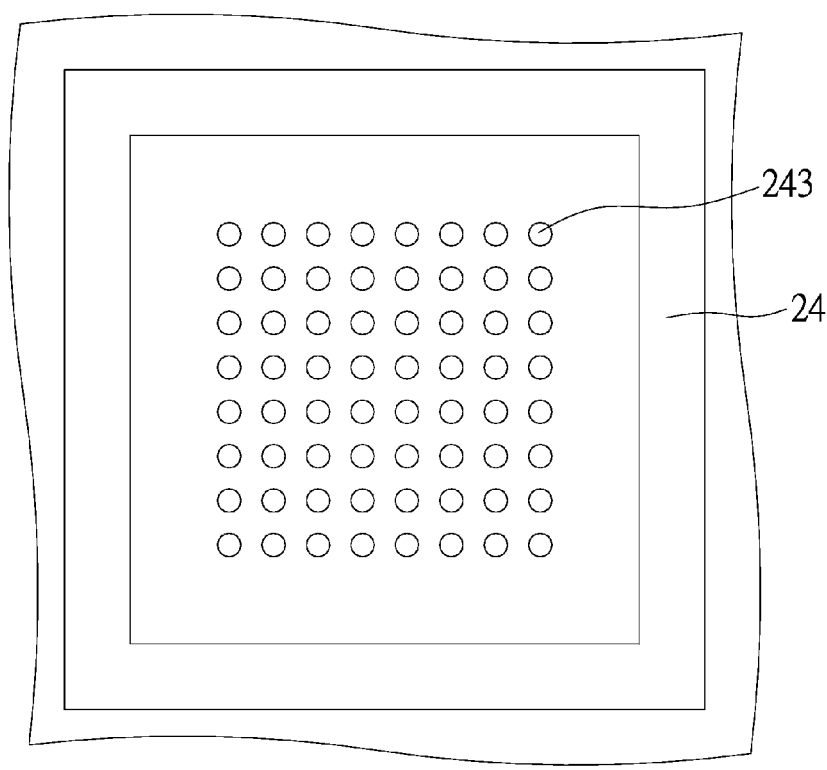
FIG. 2K'
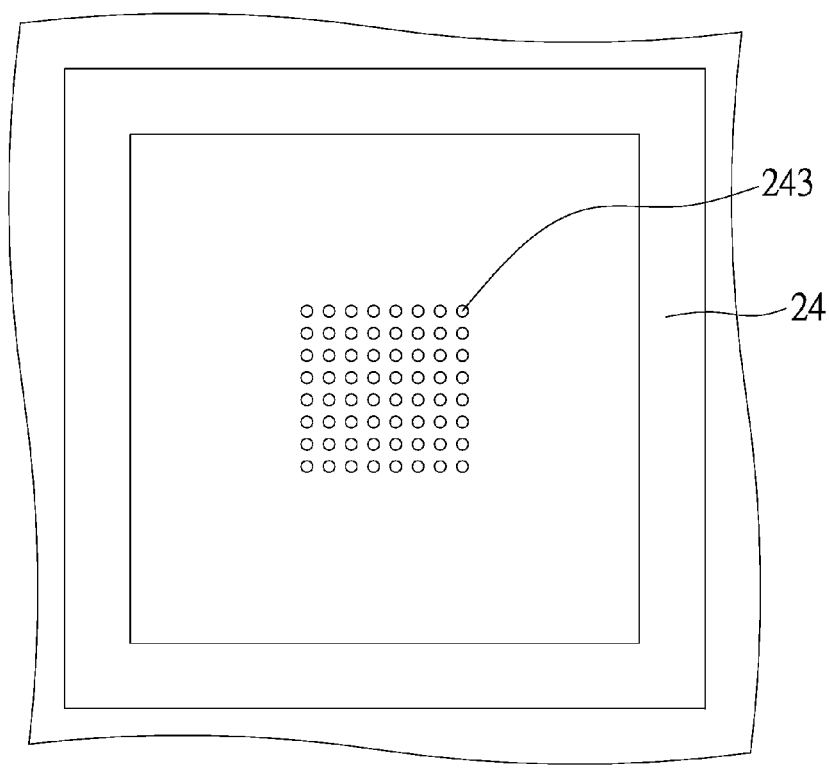
FIG. 2K"

WARPAGE-PROOF CIRCUIT BOARD STRUCTURE

FIELD OF THE INVENTION

The present invention relates to a warpage-proof circuit board structure, and more particularly, to a circuit board structure with support element.

BACKGROUND OF THE INVENTION

As electronic industry evolves rapidly, multiple functions and high performance of electronic products are of interest. In order to meet packaging requirements of high integration and miniaturization, a single-layer circuit board that provides a plurality of active and passive components and interlayer connection has evolved to multi-layer boards, so as to expand the available circuit area on the circuit boards through interlayer connection under limited space.

Currently, in most semiconductor packages, semiconductor devices (e.g. semiconductor chips and chip-type passive components etc.) are disposed on the surface of the circuit board. The circuit board that is used as the carrier for semiconductor devices is usually a core layer that can be an insulating board or double-side copper foil substrate (insulating material with copper coil on both sides). The insulating board can be made of resin material, e.g. epoxy resin, polyimide, BT (Bismaleimide Trazine) resin, FR4 resin etc. Circuits are formed on the top and bottom sides of the core layer and plated through holes are formed therein, wherein the plated through holes can be used as electrical paths for electrically conducting circuits on the top and bottom surfaces of the core layer. Dielectric layers are further formed on the surfaces on both sides of the core layer and vias formed in the dielectric layers. Then, circuit patterning processes are performed, including photoresist layer exposure and development and circuit formation, to form build-up layers, the number of build-up layers depends on design requirements. Thereafter, a solder mask made of an insulating material is formed on the outermost layer of the build-up layers. Openings are formed in the solder mask to expose circuits on the outermost layer and used as electrically connecting pads. Electrically connecting elements such as bumps are then formed on the electrically connecting pads for connecting to external electronic devices.

As shown in FIG. 1, a cross-sectional schematic diagram depicts the structure of a circuit board used in traditional semiconductor packaging. The circuit board includes a core plate 10; circuit layers 11 and 11' formed on the top and bottom surfaces of the core plate 10, respectively; build-up structures 13 and 13' formed on the circuit layers 11 and 11', respectively; solder masks 14 and 14' formed on the surface of the build-up structures 13 and 13'. The solder masks 14 and 14' are formed with openings 140 which expose a portion of the outer most layers of the build-up structures 13 and 13' so as to be electrically connecting pads 131 and 131'.

When the above circuit board is applied in semiconductor packaging processes, the purposes of the top and bottom surfaces of the core plate 10 are different. The top surface of the core plate 10 is used for carrying and electrically connecting at least one semiconductor chip and passive component; while the bottom surface of the core plate 10 is implanted with a plurality of electrically connecting elements (e.g. solder balls). In addition, the circuit board is made up of different materials, i.e. the core plate 10, the build-up structures 13 and 13' (formed from dielectric layer and metal circuits) and solder masks 14 and 14'. Since the Coefficient of Thermal Expansion (CTE) of the metal circuit layers and the dielectric layer and the solder masks are quite different, warpage is caused by temperature variation of a manufacturing process of the circuit board structure. Owing to temperature variation during manufacturing processes of the circuit board structure, for example, during baking, curing, thermal cycling processes, the circuit board structure has thermal stress that results in different amounts of deformation between the different layers. The circuit board may deform or even delaminated, or worse, cause semiconductor chip to be damaged due to the detrimental compression stress.

Along with the increase in the number of circuit layers and connecting element layout density, heat generated by highly integrated semiconductor chips in operation may significantly increase. Heat that is not efficiently dissipated may be adverse to the life of the semiconductor chips.

Thus, there is a need for a more robust circuit board structure that avoids warpage in large circuit boards due to thermal stress and increases heat dissipation efficiency for multi-layer circuit boards.

SUMMARY OF THE INVENTION

In the light of forgoing drawbacks, an objective of the present invention is to provide a warpage-proof circuit board structure so as to avoid warpage in the circuit boards during thermal processes.

Another objective of the present invention is to provide a warpage-proof circuit board structure that increases the strength of a support of the circuit board.

Still another objective of the present invention is to provide a warpage-proof circuit board structure that efficiently dissipates heat generated by semiconductor devices.

In accordance with the above and other objectives, The invention provides a warpage-proof circuit board structure, including: an inner layer circuit board; one or more dielectric layers formed on at least one surface of the inner layer circuit board and with a first groove formed at a position close to the periphery of the inner layer circuit board; a solder mask formed on the surface of the dielectric layer, a second groove corresponding in position to the first groove formed in the dielectric layer; and a metal frame formed in the first and second grooves and protruding from the surface of the solder mask.

The inner layer circuit board is a two-layer or multi-layer circuit board with patterned circuit completed.

The circuit board structure further includes a build-up circuit layer formed on the dielectric layer. Electrical conductive vias formed in the dielectric layer electrically connects the build-up circuit layer and the inner layer circuit board. A metal protecting layer is formed on the surface of the metal frame to protect it from oxidation. The metal frame includes a first metal frame formed in the dielectric layer and a second metal frame formed in the solder mask. The first metal frame or the second metal frame can be made of one selected from the group consisting of tin, silver, gold, bismuth, antimony, zinc, nickel, chromium, magnesium, indium, tellurium, and gallium.

The above structure further includes an independent washer formed along the periphery of at least one surface of the inner layer circuit board and corresponding in position to the metal frame. A first electrical conductive layer is disposed between the dielectric layer and the first metal frame, and a second electrical conductive layer is disposed between the solder mask and the second metal frame. The first and second grooves are rectangular in shape. A portion of the build-up circuit layer is in the dielectric layer in the region surrounded by the first metal frame; openings are formed in the solder mask in the region surrounded by the second metal frame for exposing a portion of the build-up circuit layer so as to be electrically connecting pads. Metal posts are formed on the electrically connecting pads.

In conclusion, the warpage-proof circuit board structure of the present invention provides a metal support element that may increase the strength of the circuit board structure, so to avoid warpage of the circuit board caused by temperature variation of the semiconductor substrate fabrication processes. At the same time, the rectangular metal frames surrounding on the surface of the circuit board can be used for heat dissipation.

BRIEF DESCRIPTION OF THE DRAWINGS

The present invention can be more fully understood by reading the following detailed description of the preferred embodiments, with reference made to the accompanying drawings, wherein:

FIG. 2E' is a top view of FIG. 2E;

FIG. 2K' is a top view of FIG. 2K; and

FIG. 2K" is a bottom view of FIG. 2K.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Referring to FIGS. 2A to 2K, a schematic diagram shows the method for manufacturing a warpage-proof circuit board structure according to an embodiment of the present invention.

Figure 1:
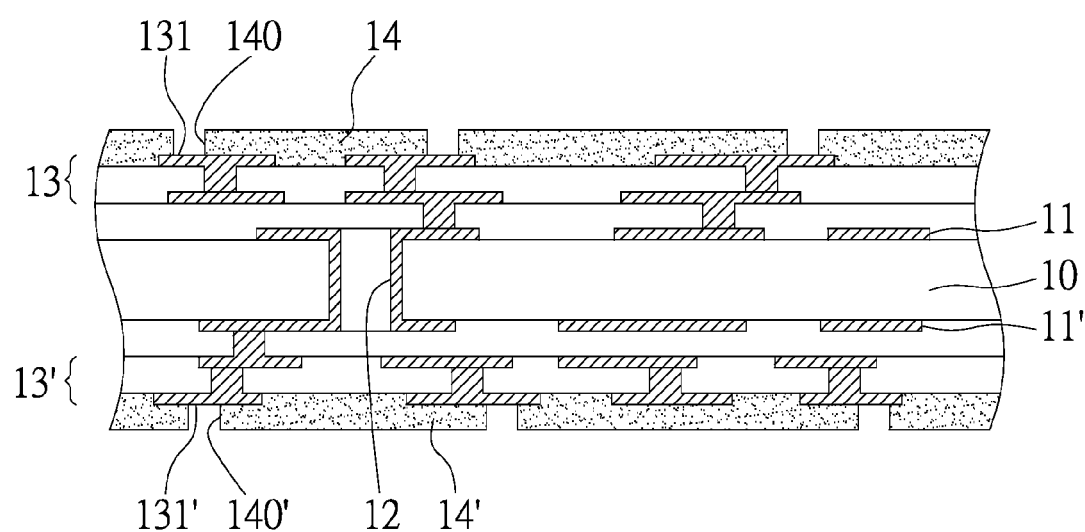
FIG. 1 is a cross-sectional schematic diagram depicting a traditional circuit board structure.
Figure 2A:
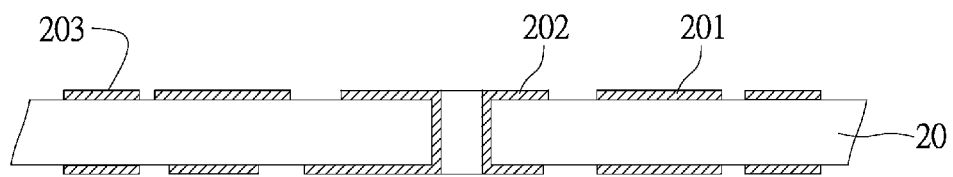
FIGS. 2A to 2K are schematic diagrams illustrating a first embodiment of a method for manufacturing a warpage-proof circuit board structure of the present invention.

Referring now to FIG. 2A, first, an inner layer circuit board is provided. The inner layer circuit board 20 is a two-layer or multi-layer circuit board with patterned circuit completed. The circuit layer 201 is formed on at least one surface of the inner layer circuit board 20, which has electrically connecting pads 202. An independent washer 203 is formed along the periphery of the at least one surface of the inner layer circuit board 20.

Figure 2B:
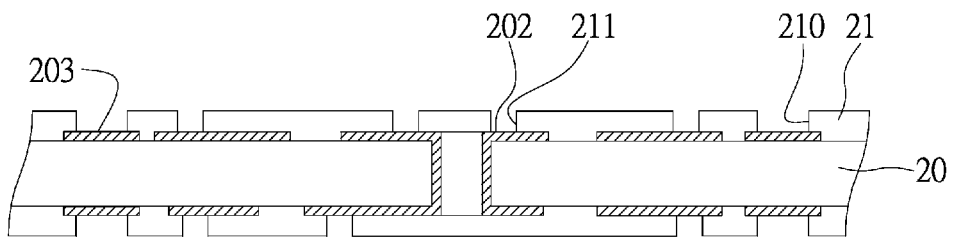

Referring to FIG. 2B, a dielectric layer 21 is formed on the at least one surface of the inner layer circuit board 20. A rectangular shaped first groove 210 corresponding in position to the independent washer 203 is formed along the periphery of the dielectric layer 21. The independent washer provides a barrier that shields laser beam used when producing the first groove 210 from the inner layer circuit board. A plurality of vias 211 are formed in the dielectric layer 21 within the area surrounded by the first groove 210 for exposing the electrically connecting pads 202 of the inner layer circuit board 20. The dielectric layer 21 can be made of an insulating material, such as FR-4 resin, FR-5 resin, epoxy resin, polyesters, cyanate ester, polyimide, BT (Bismaleimide Trazine) or glass fiber mixed with epoxy resin.

Figure 2C:
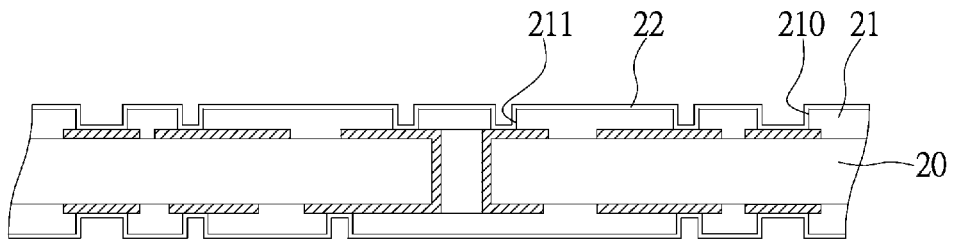

Referring to FIG. 2C, a first electrical conductive layer 22 is formed on the dielectric layer 21, the first groove 210 and the vias 211. The first electrical conductive layer 22 is used as a electrical current conducting path for electroplated metal materials, as will be mentioned later. The first electrical conductive layer 22 can be made up of metal, alloy, deposited multi-layer metal frame, for example one selected from the group consisting of copper, tin, nickel, chromium, titanium or copper-chromium alloy, or conductive polymer such as polyacetylene, polyaniline or organic sulfuric polymer.

Figure 2D:
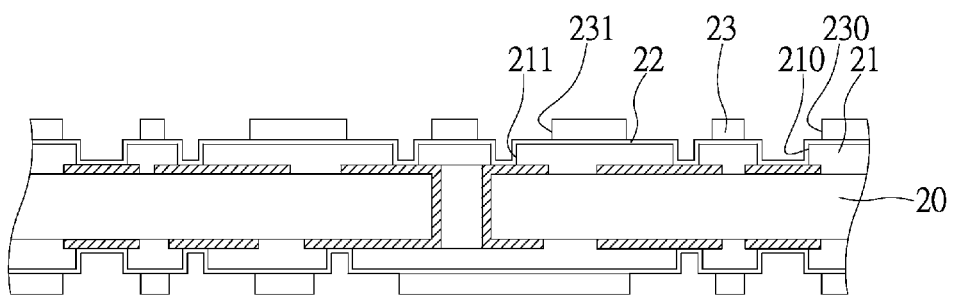

Referring to FIG. 2D, a resist layer 23 is formed on the first electrical conductive layer 22. The resist layer 23 includes a groove 230 for exposing the portions of the first electrical conductive layer 22 in the first groove 210 of the dielectric layer and a plurality of openings 231 for exposing the portions of the first electrical conductive layer 22 in the vias 211 of the dielectric layer 21. The resist layer 23 can be a dry film or liquid photoresist that can be formed on the first electrical conductive layer 22 by printing, spin coating or adhesion. The resist layer 23 can be patterned by steps such as exposure and development etc.

Figure 2E:
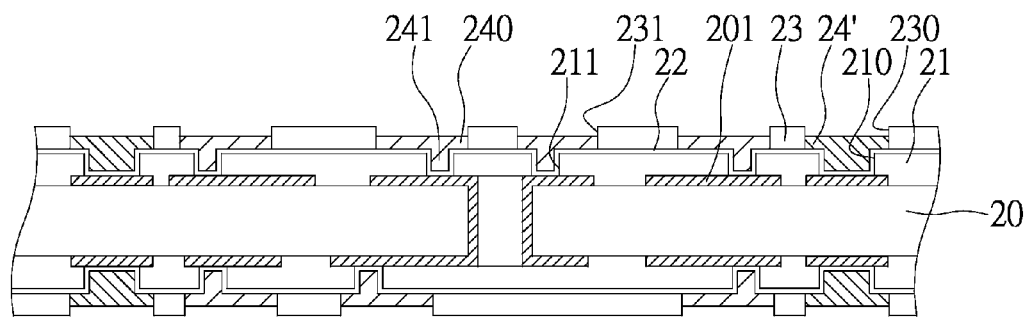
Figure 2E:
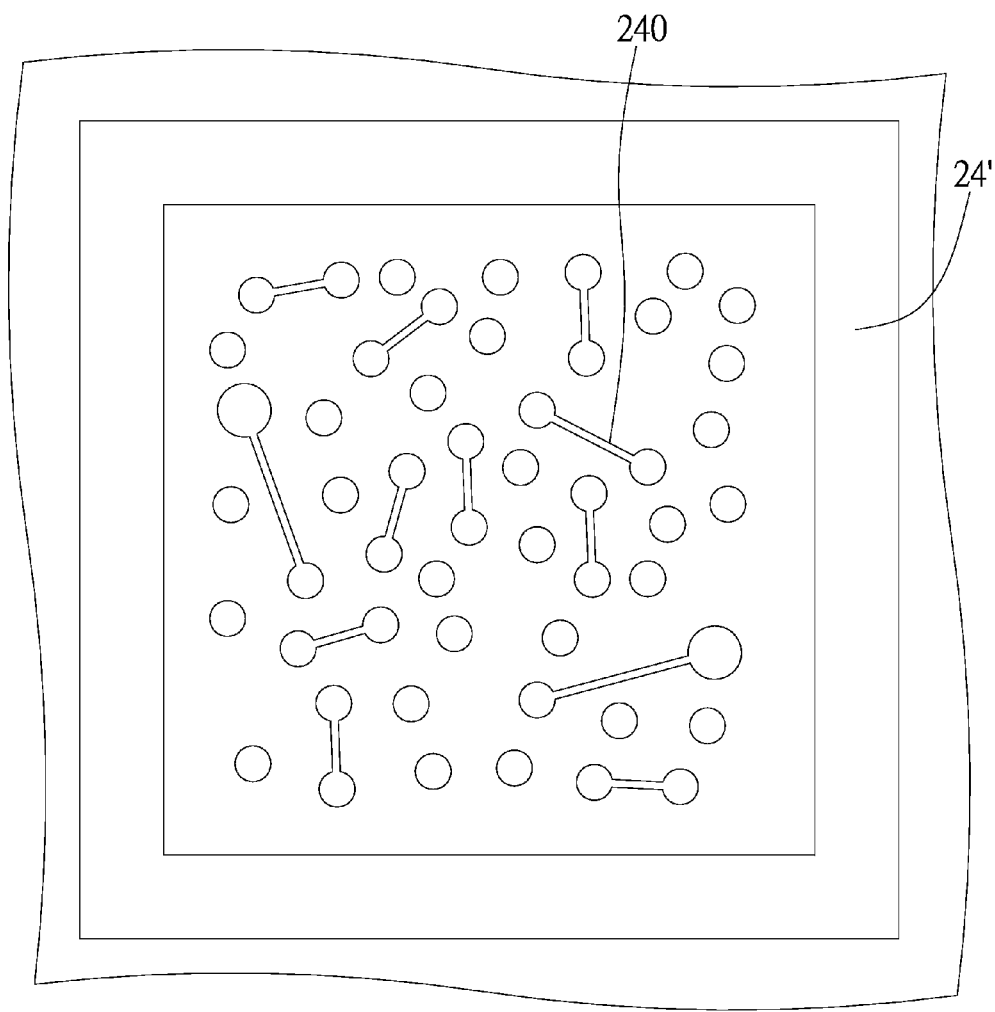

Referring to FIG. 2E, electroplating is performed, wherein the first electrical conductive layer 22 is used as the electrical current conducting path, so as to form a first metal frame 24' in the first groove 210 of the dielectric layer 21 and the resist groove 230 through electroplating. A build-up circuit layer 240 is formed by electroplating in the vias 211 of the dielectric layer 21 and on the portions of the first electrical conductive layer 22 in the resist openings 231. Electrical conductive vias 241 are formed in the dielectric layer 21 to electrically connect to the circuit layer 201 of the inner layer circuit board 20. The first metal frame 24', the build-up circuit layer 240 and the conductive vias 241 are preferably made from copper, but the present invention is not limited to this. FIG. 2E' is a top view of FIG. 2E, wherein the build-up circuit layer 240 is surrounded by the first metal frame 24'.

Figure 2F:
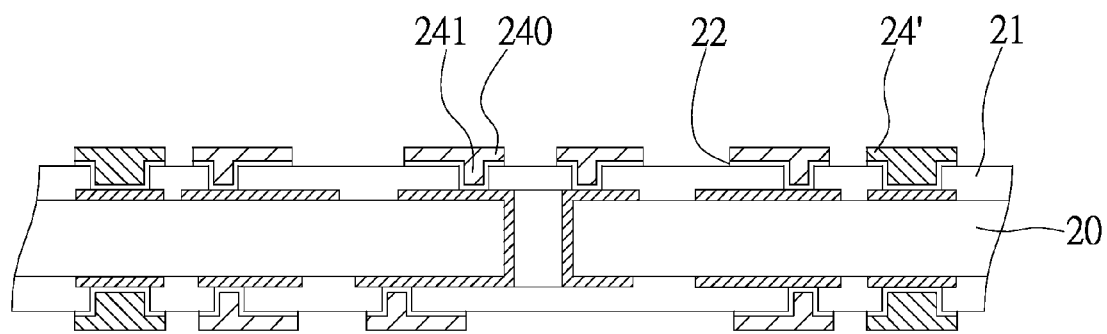

Referring to FIG. 2F, the resist layer 23 and a portion of the first electrical conductive layer 22 covered by the resist layer 23 are removed using, for example, solvent and etchant, respectively. As a result, the first metal frame 24' and the build-up circuit layer 240 protrude from the surface of the dielectric layer 21. The process for removing the resist layer 23 and the portion of the first electrical conductive layer 22 are well known in the art, and therefore further description is omitted.

Figure 2G:
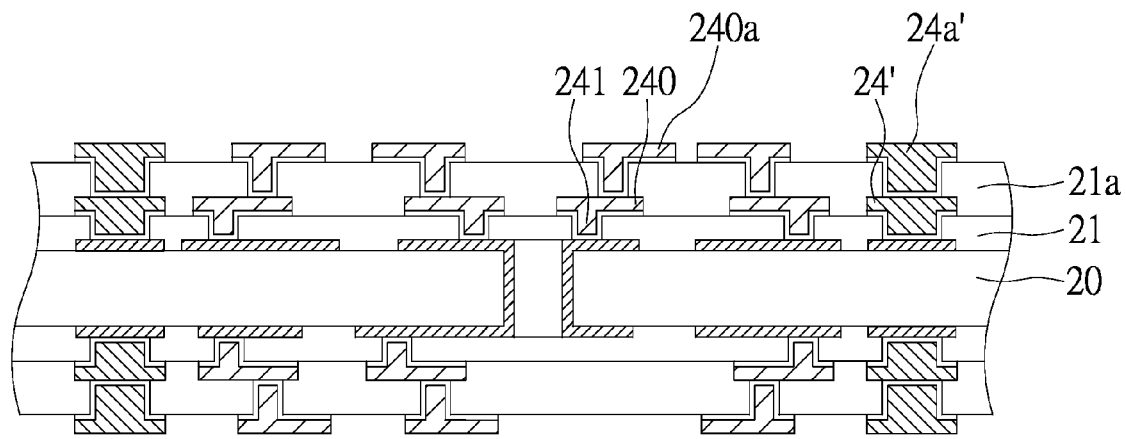

Referring to FIG. 2G, the processes in FIG. 2B to FIG. 2F are repeated to form another dielectric layer 21a, a build-up circuit layer 240a and a first metal frame 24a'. However, the present invention is not limited to the two build-up circuit layers as shown, more build-up circuit layers can be formed by repeating the above steps when necessary. The build-up circuit layer 240, 240a are connected to one another. The first metal frame 24', 24a' are connected to one another.

Figure 2H:
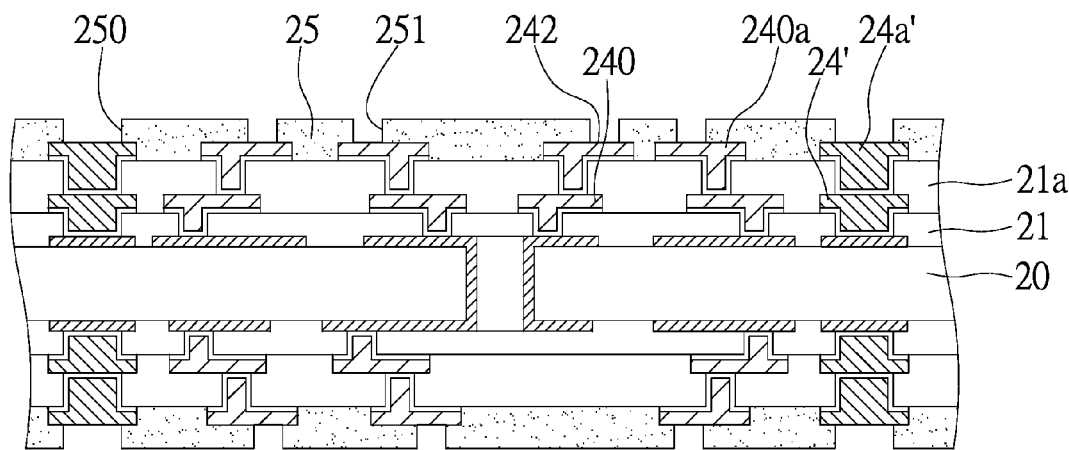

As shown in FIG. 2H, a solder mask 25 is formed on the outer most layer of the dielectric layer 21a. A rectangular second groove 250 is formed in the solder mask 25 for exposing the first metal frame 24a'. A plurality of openings 251 are also formed in the solder mask 25 for exposing the electrically connecting pads 242 in the underlying build-up circuit layer 240a.

Figure 2I:
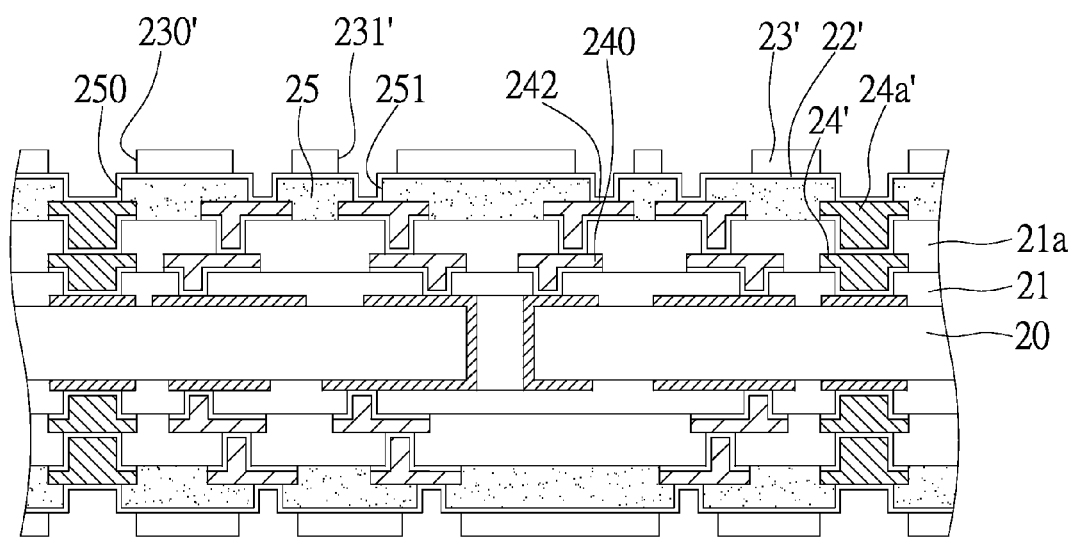

As shown in FIG. 2I, a second electrical conductive layer 22' is formed on the solder mask 25 and in the second groove 250 of the solder mask 25. Another resist layer 23' is formed on the second electrical conductive layer 22'. A groove 230' and openings 231' corresponding in position to the first metal frame 24a' and the electrically connecting pads 242 are formed in the resist layer 23', so as to expose the second electrical conductive layer 22' on the first metal frame 24a' and the electrically connecting pads 242.

Figure 2J:
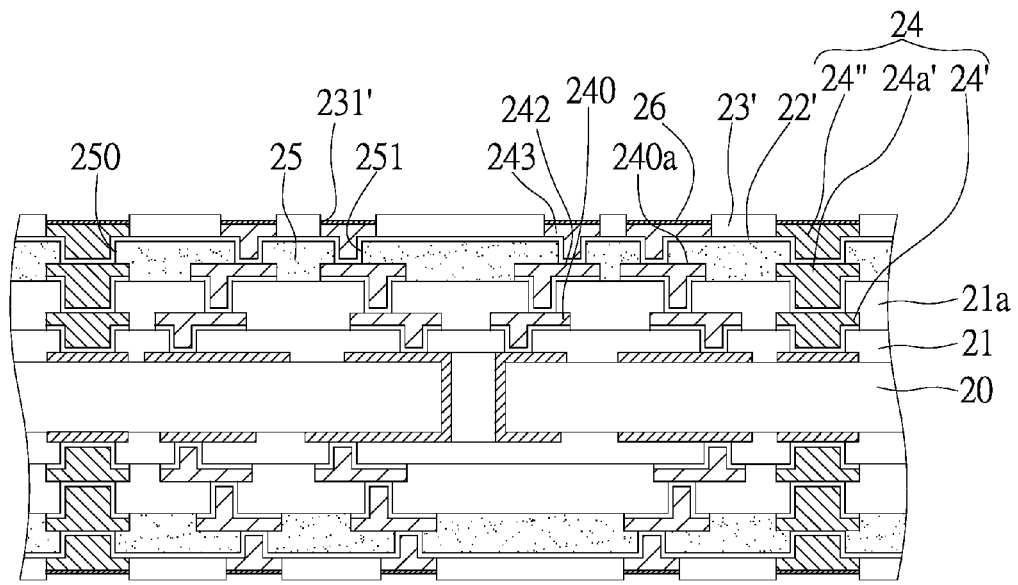

As shown in FIG. 2J, a second metal frame 24" and a metal protecting layer 26 are sequentially formed on a portion of the second electrical conductive layer 22' in the groove 230' of the resist layer 23' through electroplating. Accordingly, the second metal frame 24" is formed on the first metal frame 24', so the first metal frames 24', 24a' and second metal frame 24" constitutes a metal frame 24, which increases the strength of the inner layer circuit board 20, thus avoiding warpage. Metal posts 243 and the metal protecting layer 26 are formed on the electrically connecting pads 242 located in the openings 231' of the resist layer 23' and the openings 251 of the solder mask 25 by electroplating. The metal frame 24, the metal posts 243 and the electrically connecting pads 242 are preferably copper. The metal protecting layer 26 can be one selected from the group consisting of lead, tin, silver, gold, bismuth, antimony, zinc, nickel, chromium, magnesium, indium, tellurium, and gallium.

Figure 2K:
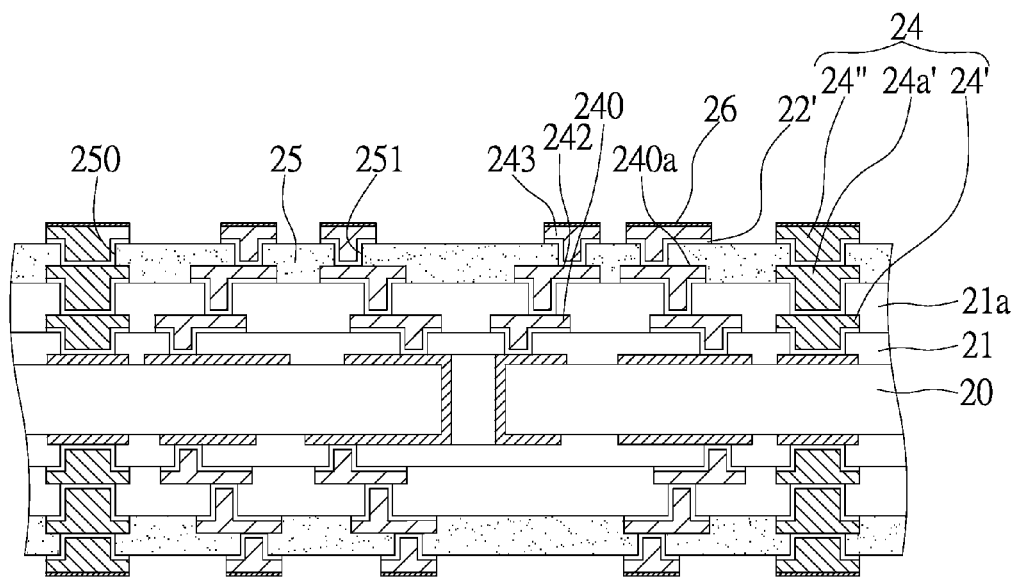

As shown in FIG. 2K, the resist layer 23' and the portion of the second electrical conductive layer 22' covered by the resist layer 23' are removed, so the second metal frame 24" protrudes from the surface of the solder mask 25, thereby avoiding warpage and dissipating heat through the exposed second metal frame 24". Additionally, FIGS. 2K' and 2K" are top views of two sides of the circuit board, respectively. As can be seen, the metal frames 24 surround the metal posts 243 on solder ball disposed side (as shown in FIG. 2K') and the metal posts 243 on chip disposed side (as shown in FIG. 2K").

The metal protecting layer 26 is formed on the second metal frame 24" and the metal posts 243 so as to protect the second metal frame 24" and the metal posts 243 from oxidation.

Furthermore, electrically connecting elements (not shown), such as solder balls, can be formed on the metal posts 243 for electrically connecting to other electronic devices.

The present invention further provides a warpage-proof circuit board structure, including: an inner layer circuit board 20; one or more dielectric layers 21 formed on at least one surface of the inner layer circuit board 20 and with a first groove 210 formed at a position close to the periphery of the inner layer circuit board 20; a solder mask 25 formed on the surface of the dielectric layer 21 and with a second groove 250 corresponding in position to the first groove 210 formed in the dielectric layer 21; and a metal frame 24 formed in the first and second grooves 210 and 250 and protruding from the surface of the solder mask 25.

The metal frame 24 is consisted of a first metal frame 24' and 24a' and a second metal frame 24". The circuit board structure further includes a build-up circuit layer 240 on the dielectric layer 21. Electrical conductive vias 241 formed in the dielectric layer 21 electrically connects the build-up circuit layer 240 and the inner layer circuit board 20. The build-up circuit layer 240 or 240a in the dielectric layer 21 is surrounded by the first metal frame 24' or 24a'. Openings 251 are formed in the solder mask 25 surrounded by the second metal frame 24" for exposing a portion of the build-up circuit layer 240a so as to be electrically connecting pads 242. Metal posts are formed on the electrically connecting pads 242.

A metal protecting layer 26 is formed on the second metal frame 24" and the metal posts 243 to protect them from oxidation.

In conclusion, the warpage-proof circuit board structure of the present invention provides a metal frame consisted of first and second metal frames to increase the strength of the circuit board structure, but the present invention is not limited to this, a metal frame can be formed at any layer in the inner layer circuit board depending on the need to avoid warpage and delamination. At the same time, the metal frames positioned on the surface of the circuit board can be used for heat dissipation.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A warpage-proof circuit board structure, comprising:
   an inner layer circuit board;
   at least one dielectric layer formed on at least one surface of the inner layer circuit board and at least one first groove formed in the at least one dielectric layer corresponding in position thereto;
   solder mask formed on the surface of the dielectric layer, a second groove formed in the solder mask and corresponding in position to the first groove in the dielectric layer;
   a metal frame formed in the first and second grooves and protruding out of the surface of the solder mask, wherein the metal frame includes a first metal frame formed in the dielectric layer and a second metal frame formed in the solder mask;
   a first electrical conductive layer formed between the dielectric layer and the first metal frame; and
   a second electrical conductive layer formed between the solder mask and the second metal frame.

2. The warpage-proof circuit board structure of claim 1, wherein the inner layer circuit board is one of two-layer and multi-layer circuit board with patterned circuit completed.

3. The warpage-proof circuit board structure of claim 1, further including a build-up circuit layer formed on the dielectric layer, the build-up circuit layer electrically connecting the inner layer circuit board through electrical conductive vias formed in the dielectric layer.

4. The warpage-proof circuit board structure of claim 1, further including a metal protecting layer formed on the surface of the metal frame.

5. The warpage-proof circuit board structure of claim 1, wherein the first metal frame is one selected from the group consisting of tin, silver, copper, gold, bismuth, antimony, zinc, nickel, chromium, magnesium, indium, tellurium, and gallium.

6. The warpage-proof circuit board structure of claim 1, wherein the second metal frame is one selected from the group consisting of tin, silver, copper, gold, bismuth, antimony, zinc, nickel, chromium, magnesium, indium, tellurium, and gallium.

7. The warpage-proof circuit board structure of claim 1, wherein the first and second grooves are rectangular in shape.

8. The warpage-proof circuit board structure of claim 3, wherein a portion of the build-up circuit layer in the dielectric layer is in the region surrounded by the first metal frame.

9. The warpage-proof circuit board structure of claim 3, wherein openings are formed in the solder mask in the region surrounded by the second metal frame for exposing a portion of the build-up circuit layer so as to be electrically connecting pads.

10. The warpage-proof circuit board structure of claim 9, further including metal posts disposed on the electrically connecting pads.

11. The warpage-proof circuit board structure of claim 1, further including an independent washer formed at a position close to the periphery of the at least one surface of the inner layer circuit board and corresponding in position to the metal frame.

* * * * *